United States Patent
Yi et al.

(10) Patent No.: US 6,777,806 B2
(45) Date of Patent: Aug. 17, 2004

(54) SEMICONDUCTOR DEVICE HAVING NO CRACKS IN ONE OR MORE LAYERS UNDERLYING A METAL LINE LAYER AND METHOD OF MANUFACTURING THE SAME

(75) Inventors: Sang Hyun Yi, Suwon (KR); Young Nam Kim, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/035,247

(22) Filed: Jan. 4, 2002

(65) Prior Publication Data
US 2002/0125572 A1 Sep. 12, 2002

(30) Foreign Application Priority Data

Feb. 20, 2001 (KR) .......................... 2001-8480

(51) Int. Cl.⁷ .................................. H01L 23/48
(52) U.S. Cl. .................. 257/750; 257/758; 438/622
(58) Field of Search ............... 257/750, 758; 438/622

(56) References Cited

U.S. PATENT DOCUMENTS 4,467,345 A * 8/1984 Ozawa ...................... 257/786
4,835,591 A * 5/1989 Matsukawa ................ 257/775
5,229,642 A   7/1993 Hara et al. ................. 257/691

FOREIGN PATENT DOCUMENTS

JP        10-84059       3/1998

* cited by examiner

Primary Examiner—Van Thu Nguyen
Assistant Examiner—Christian D. Wilson
(74) Attorney, Agent, or Firm—Lee & Sterba, P.C.

(57) ABSTRACT

A semiconductor device and a method of manufacturing the same which yields high reliability and a high manufacturing yield. The semiconductor device includes a metal line layer having a plurality of metal line patterns spaced apart from each other, and at least one underlying layer under the metal line layer, wherein the space between two adjacent metal line patterns has a sufficient width to prevent a crack from occurring in one or more of the underlying layers. The cracking of an underlying layer may also be prevented by providing a slit in a direction parallel to the space between two adjacent metal line patterns at a sufficient distance from the space between the two adjacent metal line patterns.

10 Claims, 17 Drawing Sheets

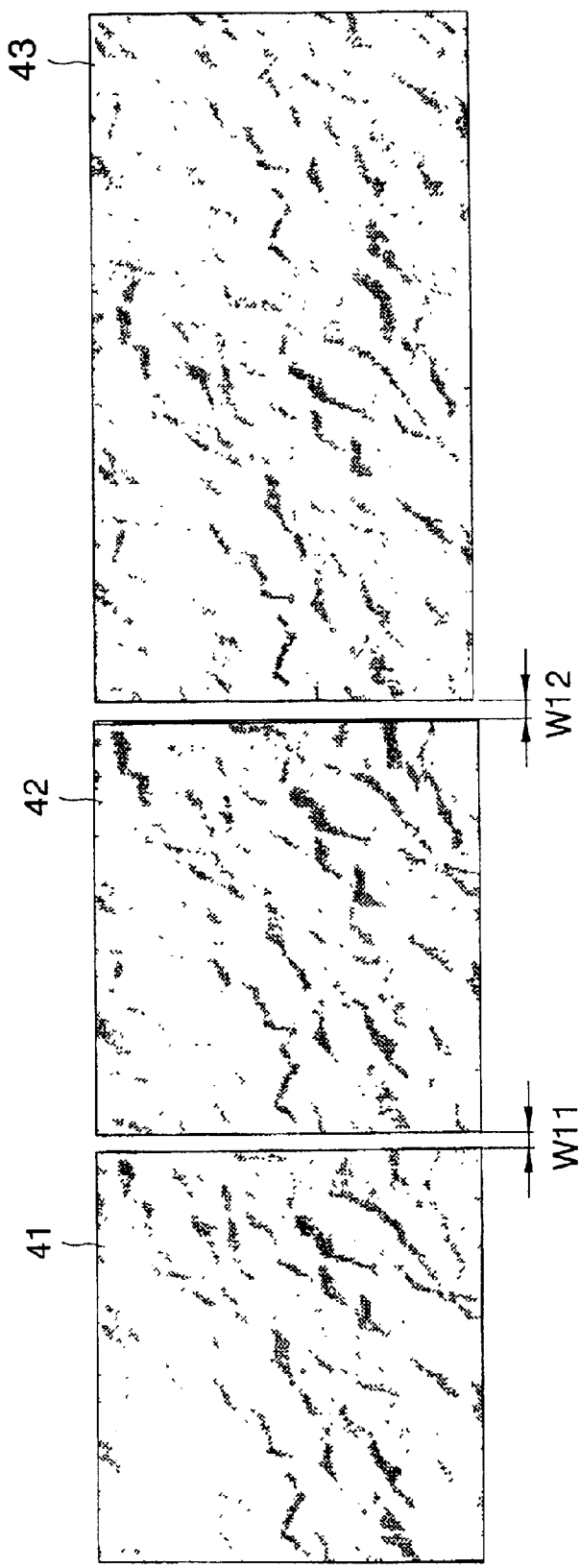

SEMICONDUCTOR DEVICE HAVING NO CRACKS IN ONE OR MORE LAYERS UNDERLYING A METAL LINE LAYER AND METHOD OF MANUFACTURING THE SAME

BACKGROUND OF THE INVENTION

1. Field of the Invention

The present invention relates to a semiconductor device and a method of manufacturing the same. More specifically, the present invention is directed to the techniques that can prevent a crack from occurring in the layers underlying a metal line layer due to the size of the metal line or a space between two adjacent metal line layers.

2. Description of the Related Art

Semiconductor devices generally have a multi-layered structure. When manufacturing such semiconductor devices having a multi-layered structure, only a metal line pattern is inspected, but stresses that are applied to, for example, an insulation layer beneath the metal layer are not considered. Such stresses (e.g., a thermal stress) may cause cracks in one or more layers underlying the metal layer, for example, an insulation layer. As a result, the characteristics of a semiconductor device may deteriorate.

FIG. 1 illustrates a schematic cross-sectional view of a conventional semiconductor device having a multi-layered structure. The semiconductor memory device includes a first insulation layer 12, a resistive layer 13, a second insulation layer 14, a barrier layer 15, and a metal line layer 16, which are sequentially formed on a substrate 11.

In the semiconductor device having such a multi-layered structure of FIG. 1, when a subsequent annealing process is performed after forming the metal line layer 16, the stress structure is changed. In other words, due to a thermal stress, the stress direction in one or more of the layers 13 to 16 is changed as shown in FIGS. 2A and 2B. FIG. 2A illustrates a cross-sectional view of a stress direction before an annealing process is performed, and FIG. 2B illustrates a cross-sectional view of a stress direction in underlying layers after an annealing process is performed. In FIGS. 2A and 2B, the arrows denote the stress direction.

As the direction of a stress is changed, the stress is accumulated and, thus, a crack 17 may occur in a portion of the second insulation layer 14 corresponding to a gap in the metal line layer 16 as shown in FIG. 1. FIGS. 4A to 4D are photographs illustrating cracks that occur due to a stress in the conventional semiconductor device. Furthermore, when a crack is deepened, as shown in FIGS. 3A and 3B, the resistive layer 13 may be destroyed, thereby causing a low reliability. FIGS. 3A and 3B are photographs illustrating a crack that occurs in the resistive layer 13.

Japanese Patent Publication No. 10-84059 describes a technique that relaxes the concentration of stress on the peripheral edge of a metal board to prevent an underlying ceramic board from deteriorating in mechanical strength and to protect it against cracking. In this technique a groove is provided inside the peripheral edge of one of the surfaces of the metal plate whose other surface is bonded to a high-thermal conductivity silicon nitride board (ceramic board).

U.S. Pat. No. 5,229,642 describes a technique that forms slits or rows of small holes in corner portions of a guard ring to prevent a passivation film on the guard ring from being cracked by stresses caused by a resin mold package concentrating in the four corners of the semiconductor substrate.

However, the prior art as described above does not suggest a technique that prevents a crack from occurring in one or more layers underlying the metal line layer due to the size of the metal line or a gap between two adjacent metal line layers.

SUMMARY OF THE INVENTION

To overcome the problems described above, preferred embodiments of the present invention provide a semiconductor device and a method of manufacturing the same that can prevent a crack from occurring in one or more layers underlying a metal line layer. Another feature of the present invention is to provide a semiconductor device and a method of manufacturing the same that results in high reliability and a high manufacturing yield.

A feature of a preferred embodiment of the present invention provides a semiconductor device having a plurality of metal line patterns having a predetermined surface area size, and two adjacent metal line patterns spaced apart from each other at a predetermined distance.

Another feature of a preferred embodiment of the present invention further provides a semiconductor device having a metal line layer with a plurality of metal line patterns spaced apart from each other, and at least one underlying layer under the metal line layer, wherein the space between two adjacent metal line patterns has a sufficient width to prevent a crack from occurring in the underlying layer.

The metal line pattern has a surface area size of greater than "30 $\mu$m×30 $\mu$m". The distance between two adjacent metal lines is greater than 1.0 $\mu$m, and preferably, greater than 1.5 $\mu$m. Preferably, the underlying layer is an insulating layer.

Another feature of a preferred embodiment of the present invention further provides a semiconductor device having a plurality of metal line patterns, and two adjacent metal line patterns spaced apart from each other with at least one of the two adjacent metal line patterns having a slit.

A preferred embodiment of the present invention further provides a semiconductor device having a metal line layer with a plurality of metal line patterns spaced apart from each other, at least one underlying layer under the metal line layer, and a slit formed at a sufficient distance from the space between two adjacent metal line patterns to prevent a crack from occurring in the underlying layer.

The slit is formed in a direction parallel to the space between the two adjacent metal line patterns. The width of the slit is greater than 1.0 $\mu$m. The distance from the space between two adjacent metal line patterns to the slit is less than 4.0 $\mu$m.

Another feature of a preferred embodiment of the present invention further provides a method of manufacturing a semiconductor device having a multi-layered structure. The method includes forming at least one underlying layer on a semiconductor substrate; and forming a metal line layer on the underlying layer, the metal line layer including a plurality of metal line patterns spaced apart from each other at a predetermined distance. The predetermined distance between adjacent metal lines is greater than 1.0 $\mu$m, and preferably, greater than 1.5 $\mu$m.

Another feature of a preferred embodiment of the present invention further provides a method of manufacturing a semiconductor device having a multi-layered structure. The method includes forming at least one underlying layer on a substrate; forming simultaneously a metal line layer on the underlying layer and a slit, the metal line layer including a plurality of metal line patterns spaced apart from each other, at least one of two adjacent metal lines having a slit.

Another feature of a preferred embodiment of the present invention further provides a method of manufacturing a semiconductor device. The method includes forming at least one underlying layer on a substrate; forming simultaneously a metal line layer on the underlying layer and a slit, the metal line layer including a plurality of metal line patterns spaced apart from each other, the slit formed at a sufficient distance from a space between two adjacent metal line patterns to prevent a crack from occurring in the underlying layer.

These and other features of the present invention will be readily apparent to those of ordinary skill in the art upon review of the detailed description that follows.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which:

FIG. 5 is an SEM micrograph illustrating a front surface of a semiconductor device according to a first preferred embodiment of the present invention;

DETAILED DESCRIPTION OF THE INVENTION

Figure 1:
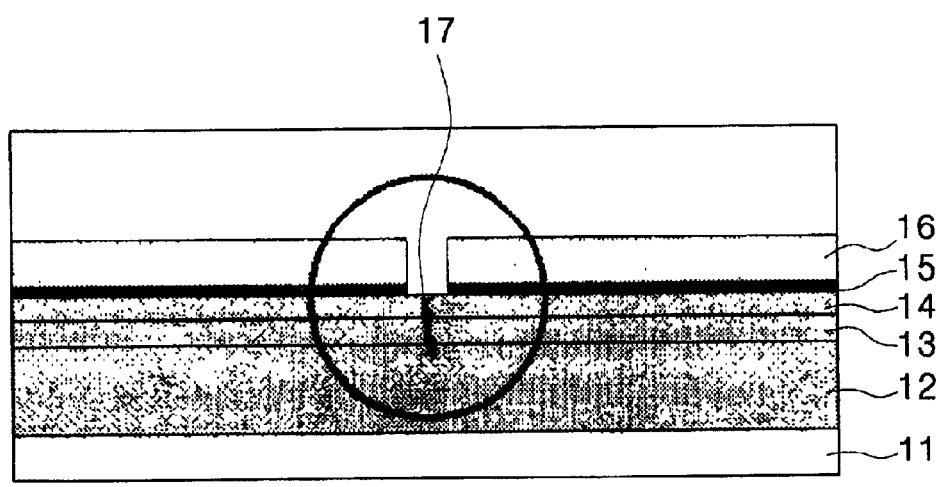
FIG. 1 illustrates a schematic cross-sectional view of a conventional semiconductor device having a multi-layered structure according to the prior art.
Figure 2A:
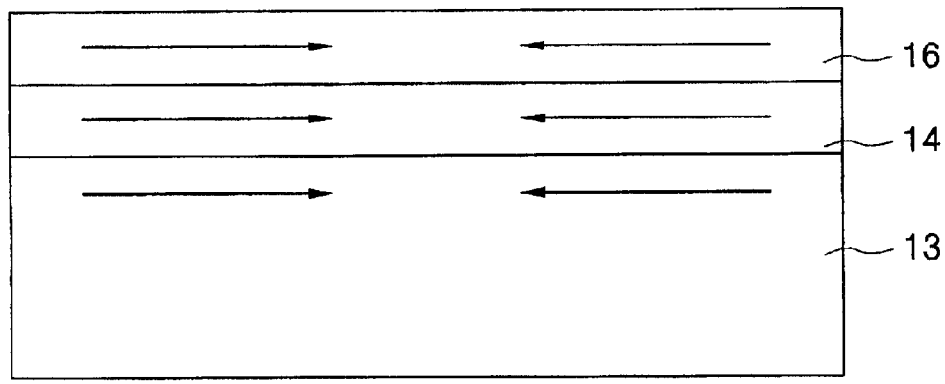
FIG. 2A illustrates a schematic cross-sectional view of the direction of a stress before an annealing process is performed according to the prior art.
Figure 2B:
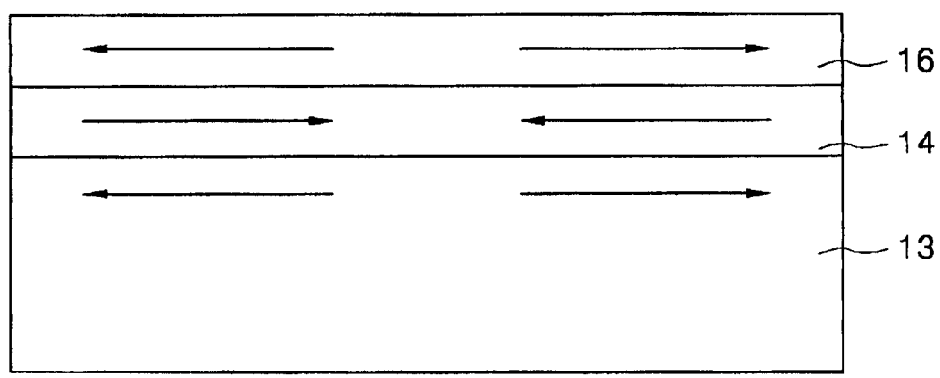
FIG. 2B illustrates a schematic cross-sectional view of the direction of a stress after an annealing process is performed according to the prior art.
Figure 3A:
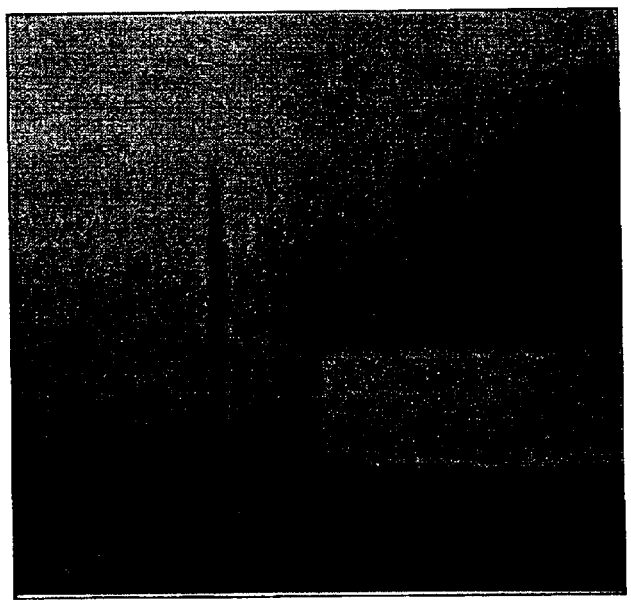
FIGS. 3A and 3B are SEM micrographs illustrating a crack that occurs in the resistive layer.
Figure 3B:
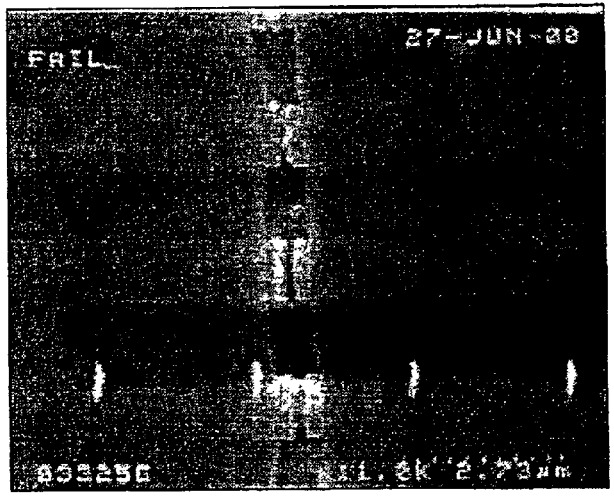
Figure 4A:
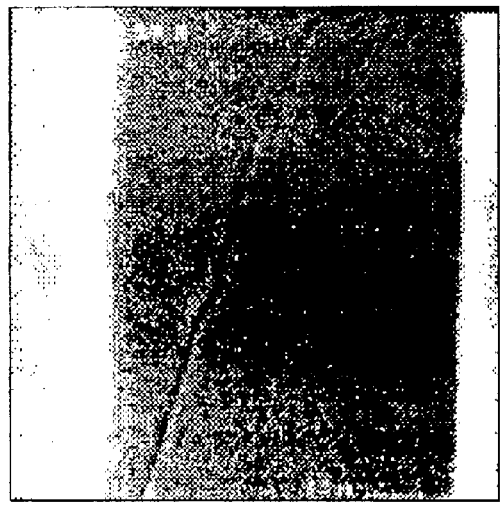
FIGS. 4A to 4D are SEM micrographs illustrating cracks that occur due to a stress in the conventional semiconductor device.
Figure 4B:
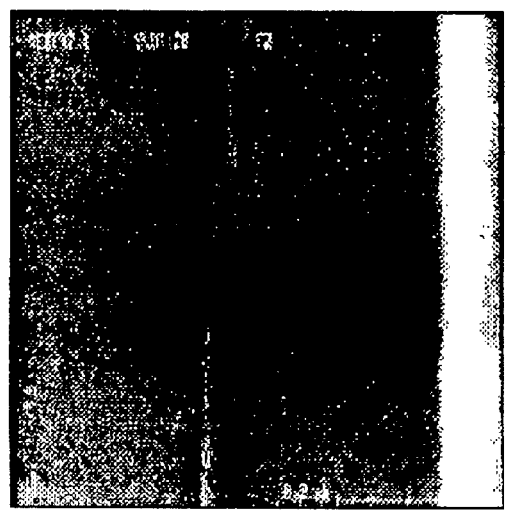
Figure 4C:
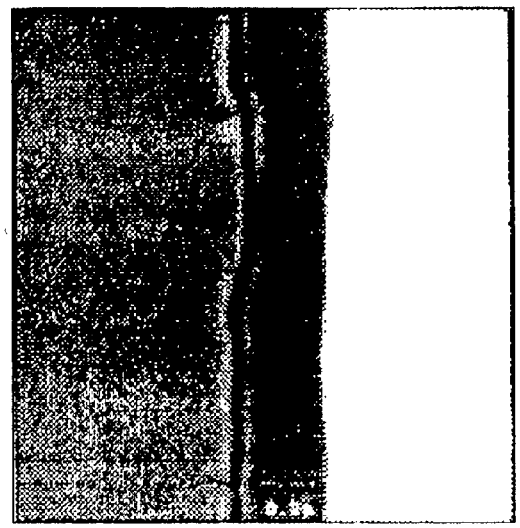
Figure 4D:
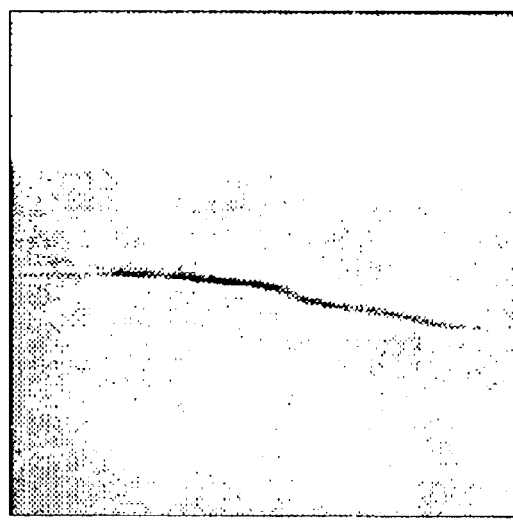

Korean Patent Application No. 2001-8480, filed on Feb. 20, 2001, and entitled: "Semiconductor Device and Method of Manufacturing the Same," is incorporated by reference herein in its entirety.

The present invention now will be described more fully with reference to the accompanying drawings, in which preferred embodiments of the invention are shown. This invention may, however, be embodied in many different forms and should not be construed as being limited to the embodiments set forth herein; these embodiments are provided so that this disclosure will be thorough and complete, and will fully convey the concept of the present invention to those of ordinary skill in the art. In the drawings, the thickness of layers and regions are exaggerated for clarity. It will also be understood that when a layer is referred to as being on another layer or substrate, it may be directly on the other layer or substrate, or one or more intervening layers may also be present. Further, it will be understood that when a layer is referred to as being under another layer, it may be directly under, or one or more intervening layers may also be present.

FIG. 5 is an SEM micrograph illustrating the front surface of a semiconductor device according to a first preferred embodiment of the present invention. As shown in FIG. 5, two adjacent metal line patterns 41 and 42 are spaced apart from each other, and two adjacent metal line patterns 42 and 43 are spaced apart from each other. A space between the two adjacent metal line patterns 41 and 42 has a width W11, and a space between the two adjacent metal line patterns 42 and 43 has a width W12. The metal line patterns 41 to 43 have a relatively large surface area size of, e.g., greater than "30 $\mu$m×30 $\mu$m". This is because if the metal line patterns 41 to 43 have a relatively small surface area size of, e.g., less than "30 $\mu$m×30 $\mu$m", little crack occurs in one or more layers underlying the metal line layer, e.g., the insulating layer. However, the surface area size of the metal line patterns is not limited to the above value in the present invention.

Even though not shown, the semiconductor device of FIG. 5 has a multi-layered structure. For example, as in FIG. 1, the semiconductor memory device includes a first insulation layer, a resistive layer, a second insulation layer, a barrier layer, and a metal line layer, which are sequentially formed in this order on a substrate.

The widths W11 and W12 are sufficiently wide to prevent a crack from occurring in one or more layers underlying the metal line patterns.

Preferably, the widths W11 and W12 are greater than 1.0 $\mu$m. To accommodate a high stress resulting from a process parameter, it is more preferable that the widths W11 and W12 are at least 1.5 $\mu$m. However, if the widths W11 and W12 are very wide, the integration level of the semiconductor device is lowered, and thus it is undesirable that the widths W11 and W12 are very wide.

Figure 6:
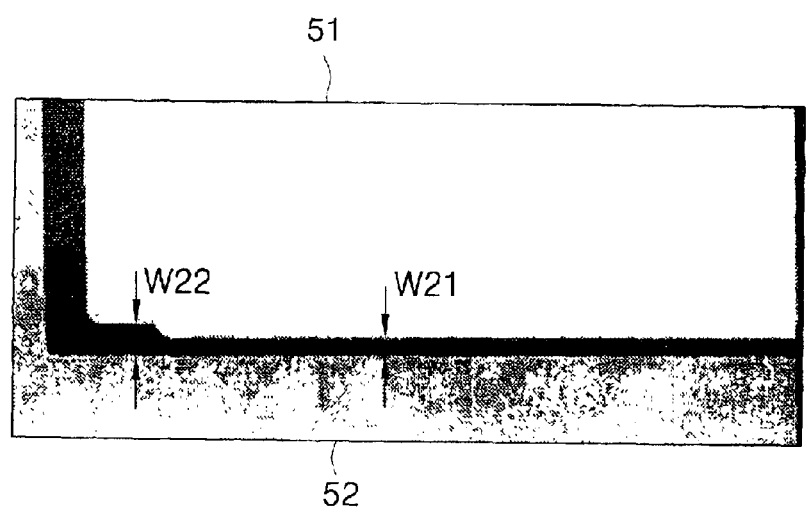
FIG. 6 is an SEM micrograph illustrating an occurrence of a crack due to a width of a space between the metal line patterns.

FIG. 6 is an SEM micrograph illustrating an occurrence of a crack due to a width of the space between the metal line patterns. In FIG. 6, the black portion denotes a space between two adjacent metal line patterns 51 and 52. A width W21 of the space is 0.75 $\mu$m, and a width W22 of the space is 1.31 $\mu$m. As shown in FIG. 6, a crack occurs not in a portion of one or more layers (e.g., the insulating layer) underlying the metal layers which correspond to the width W22, but in one or more layers underlying the metal layers which correspond to the width W21.

Figure 7:
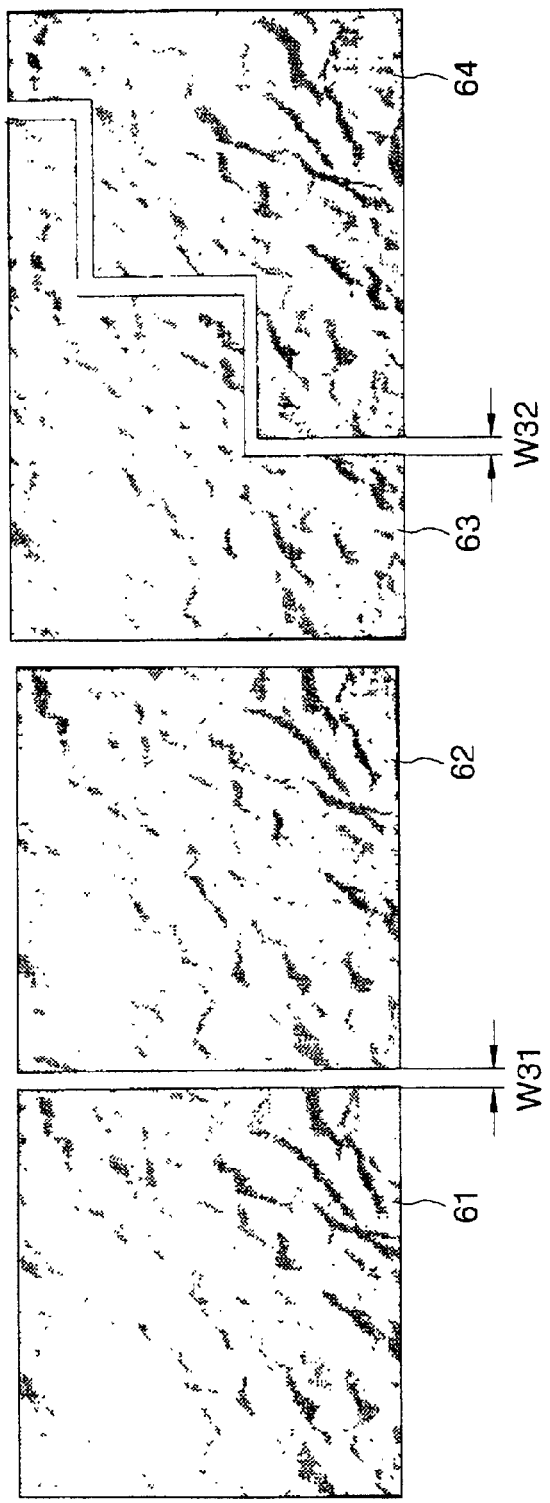
FIG. 7 is an SEM micrograph illustrating a front surface of the semiconductor device having metal line patterns according to the first preferred embodiment of the present invention.

FIG. 7 is an SEM micrograph illustrating a front surface of a semiconductor device having an alternate metal line pattern according to a first preferred embodiment of the present invention. As shown in FIG. 7, the metal line patterns 63 and 64 have a bent space therebetween. As described above, it is preferred that a space between two adjacent metal line patterns 61 and 62 or 62 and 63 is at least 1.0 μm in width. However, if the bent space between the metal line patterns 63 and 64 is 1.0 μm, a crack is likely to occur in one or more layers underlying the metal line layer.

Therefore, if a space between two metal line patterns has one or more bent portions or one or more step portions, it is preferable that the width of the bent space is greater than 1.5 μm.

Meanwhile, it is difficult to form a space having a width of greater than 1.0 μm or 1.5 μm between two adjacent metal line patterns and still achieve high integration. In order to solve such a problem, a second preferred embodiment of the present invention forms a slit at a distance of within, preferably, 4.0 μm from a space between two adjacent metal line patterns.

Figure 8:
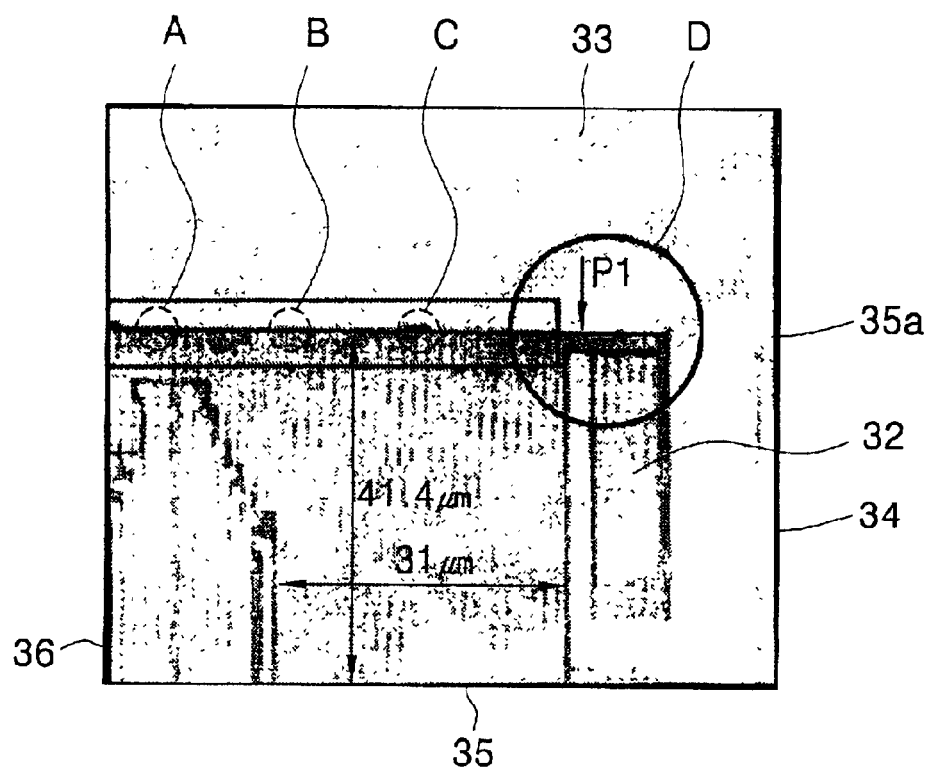
FIGS. 8 to 10 are SEM micrographs illustrating a background art related to the second preferred embodiment of the present invention.
Figure 9:
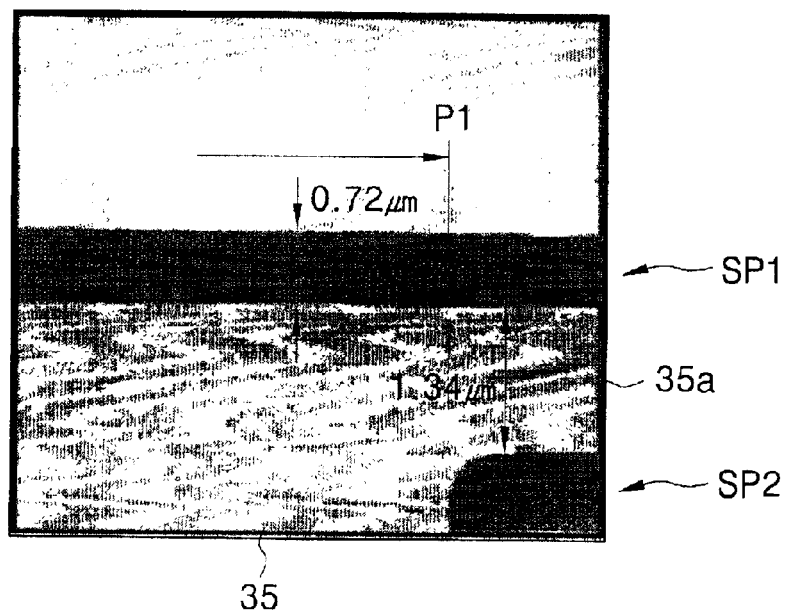
Figure 10:
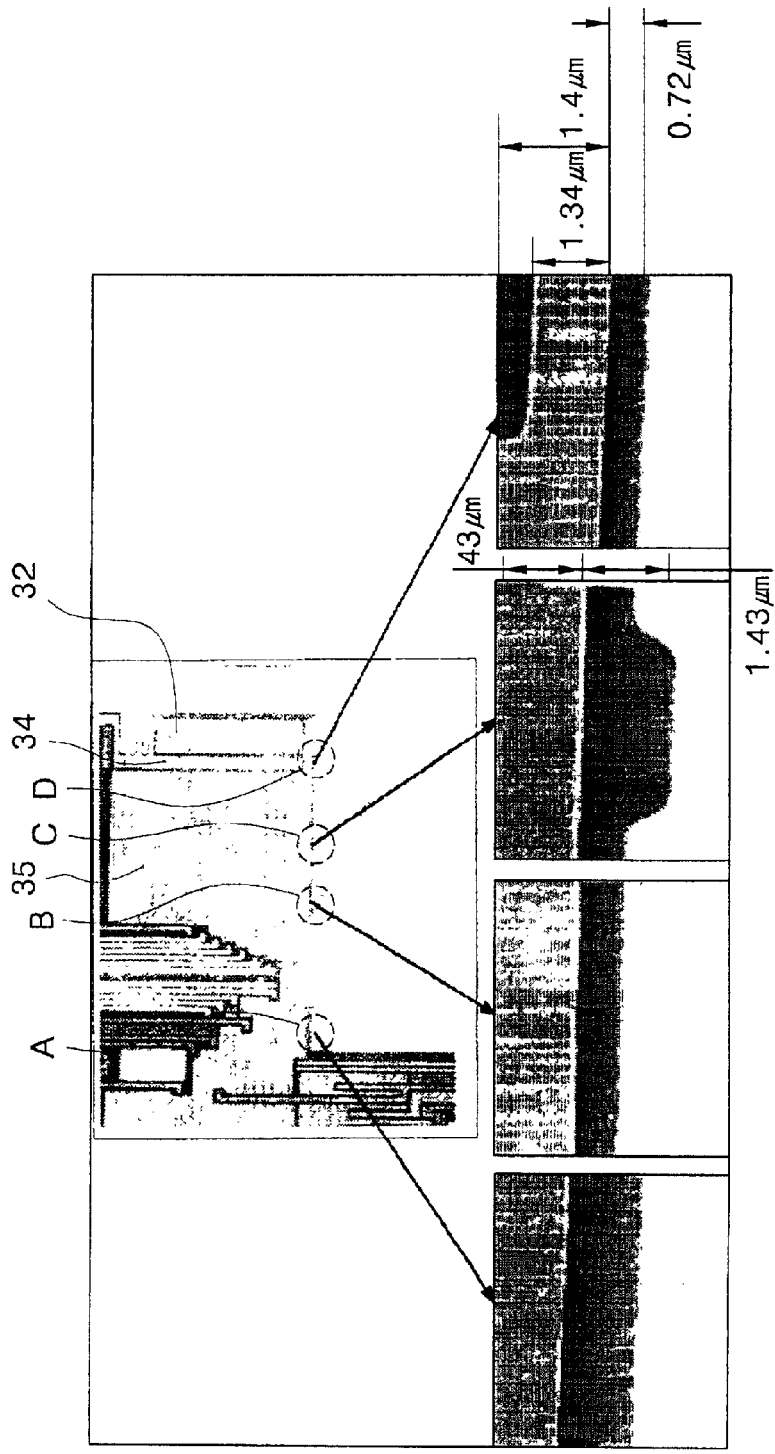

FIGS. 8 to 10 provide the background art related to the second preferred embodiment of the present invention. FIG. 8 is an SEM micrograph illustrating a portion of a conventional semiconductor device, and FIG. 9 is an enlarged view illustrating a portion D of FIG. 8. FIG. 10 is an SEM micrograph illustrating a progressive state of a crack for an area size of the metal line patterns and a space width between the metal line patterns. In FIGS. 8 to 10, reference numerals 32 to 36 denote metal line patterns, and black lines denote spaces between the two adjacent metal line patterns. In FIG. 8, a portion defined by a dotted line denotes a region where a crack occurs.

Referring to FIGS. 8 and 9, a crack does not occur in a portion of a space SP1 corresponding to the metal line patterns 36, whereas a crack does occur in a portion of the space SP1 between the metal line patterns 33 and 35. At this point, the crack generated stops at a position P1. This is because the growth of a crack is hindered by a space SP2 between a portion 35a of the metal line pattern 35 and an upper portion of the metal line pattern 34.

For more detail, as shown in FIG. 10, a crack does not occur in a portion A of the space SP1 having a width of 1.43 μm, but a crack occurs in portion B of the space SP1 having a width of 0.8 μm. The crack that occurs in a portion B of the space SP1 goes through a portion C of the space SP1 having a width of 1.43 μm, and then stops at a position P1 before a portion D of the space SP1 having a width of 0.72 μm. The reason for this is that the space SP2 serves to stop growth of a crack. That is, it is understood that if a slit is formed that exposes a layer underlying the metal layer, e.g., the insulation layer, a crack no longer occurs.

Figure 11:
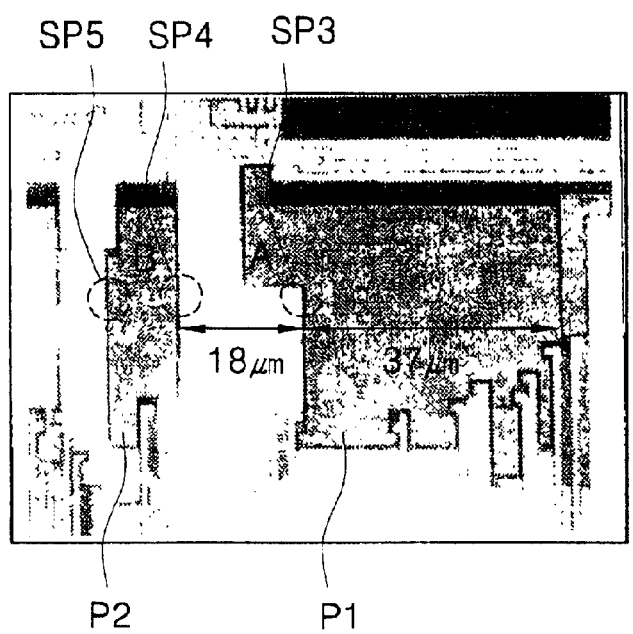
FIG. 11 is an SEM micrograph illustrating another background art related to the second preferred embodiment of the present invention.

FIG. 11 provides further background art related to the second preferred embodiment of the present invention. As shown in FIG. 11, a metal line pattern P1 is interposed between metal line patterns having a relatively large surface area size, while a metal line pattern P2 is interposed between metal line patterns having a relatively small surface area size. Spaces SP3 and SP4 have a width of 0.7 μm. Even though the space SP4 has a width of 0.7 μm, which is less than 1.0 μm, since the metal line pattern P2 is interposed between the long slim metal line patterns that are formed to be parallel to each other, a crack does not occur in the space SP4. On the other hand, since the metal line pattern P1 is interposed between the metal line patterns having a relatively large surface area, a crack occurs in the space SP3. In other words, since a space SP5 serves as a slit that prevents a crack from occurring, a crack does not occur in one or more of the layers underlying the metal line pattern that correspond to the space SP4. It is understood that the slit has to be formed parallel to the space between the metal line patterns in order to prevent a crack from occurring.

Figure 12:
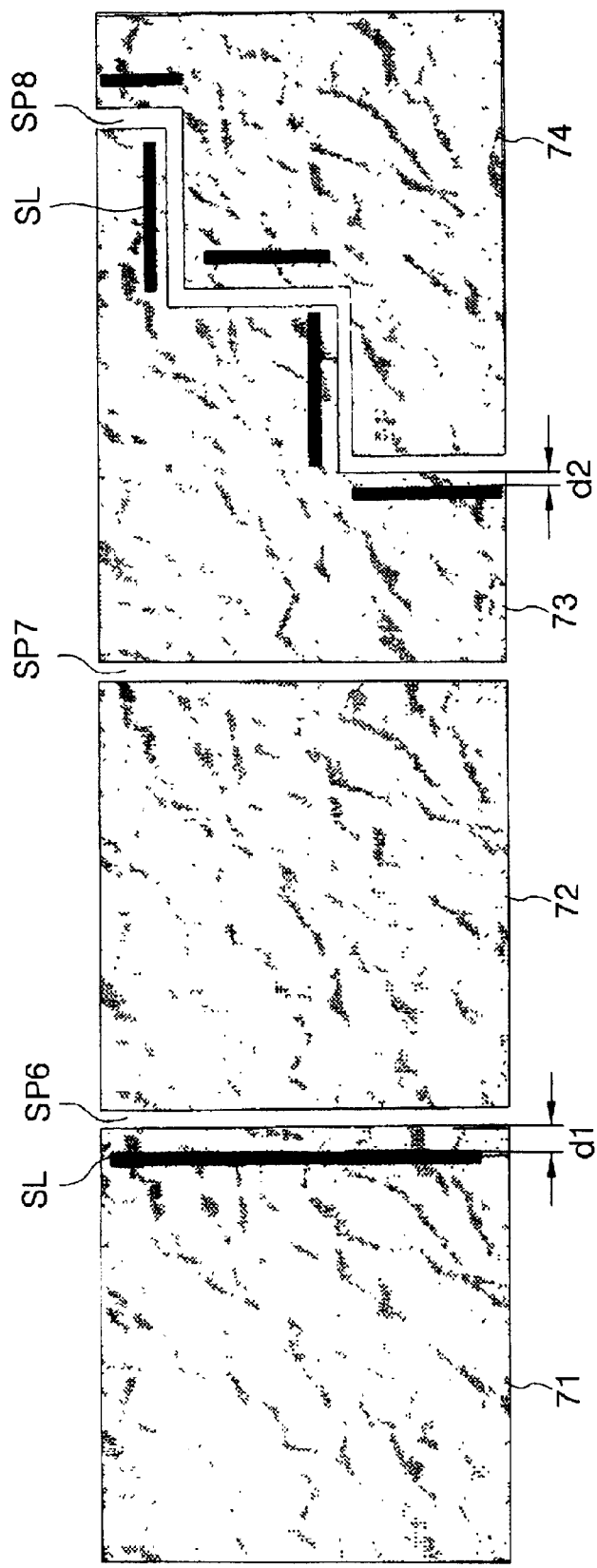
FIG. 12 is an SEM micrograph illustrating a front surface of a semiconductor device according to the second preferred embodiment of the present invention.

FIG. 12 is an SEM micrograph illustrating a front surface of a semiconductor device according to the second preferred embodiment of the present invention. As shown in FIG. 12, a space SP6 between metal line patterns 71 and 72 and a space SP7 between metal line patterns 72 and 73 are straight, whereas a space between two adjacent metal line patterns 73 and 74 is bent. The spaces SP6 to SP8 between two adjacent metal line patterns 71 and 72, 72 and 73, and 73 and 74, respectively have a width of less than 1.0 μm to achieve high integration. The metal line patterns 71 to 74 have a relatively large surface area size of, e.g., greater than "30 μm×30 μm". However, the surface area size of the metal line patterns is not limited to this value in the present invention.

In order to prevent a crack from occurring in one or more layers underlying the metal line layer, slits SL are formed at a predetermined distance from the space between the metal line patterns, and the slits SL are arranged in a direction parallel to the space between the metal line patterns. Preferably, the slit SL has a width of greater than 1.0 μm. The distances d1 and d2 between the slit SL and the corresponding space between the metal line patterns have a maximum value of, preferably, 4.0 μm. The length of the slit SL is selected such that the metal line patterns are not broken. In the case of the space SP8 that is bent, it is preferred that the slits SL are formed to correspond to straight portions of the bent space SP8. In other words, the slits SL are formed at a location adjacent to any portion of the space having a possibility to cause a crack.

A process of forming the slit in the metal line pattern according to the second preferred embodiment of the present invention does not require an additional mask process. The slit may be formed by patterning a portion of the metal line layer adjacent to the space between two adjacent metal line patterns concurrently with patterning the metal line layer.

Figure 13:
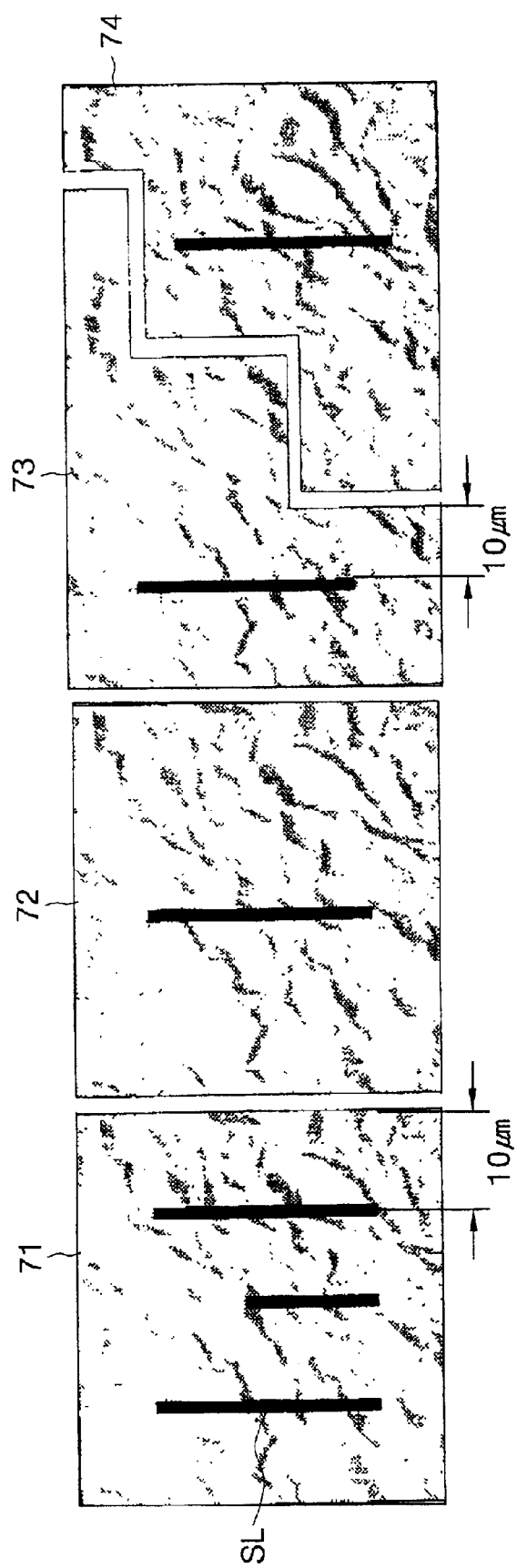
FIG. 13 illustrates slits that not properly formed.

FIG. 13 shows improperly formed slits. As described above, the slit SL has to be located at a distance less than 4.0 μm from the space between the metal line patterns; otherwise, a crack occurs.

Figure 14:
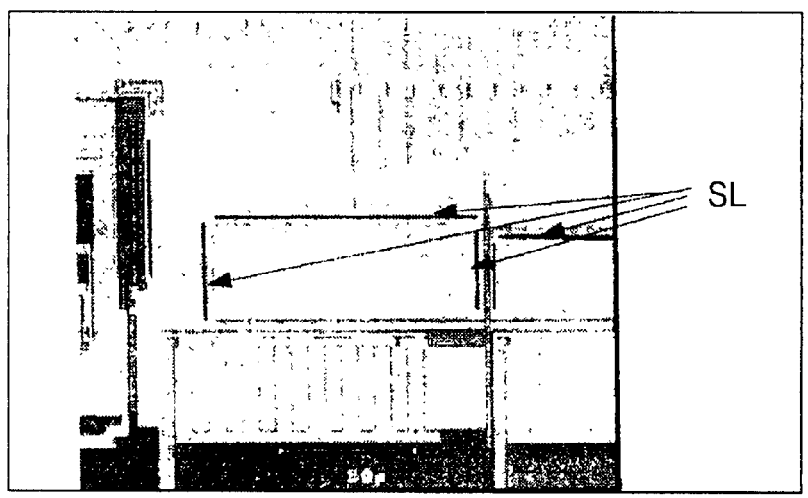
FIG. 14 is an SEM micrograph illustrating the slits formed to prevent a crack from occurring according to the second preferred embodiment of the present invention.

FIG. 14 is an SEM micrograph illustrating the slits formed to prevent a crack from occurring according to the second preferred embodiment of the present invention.

Figure 15:
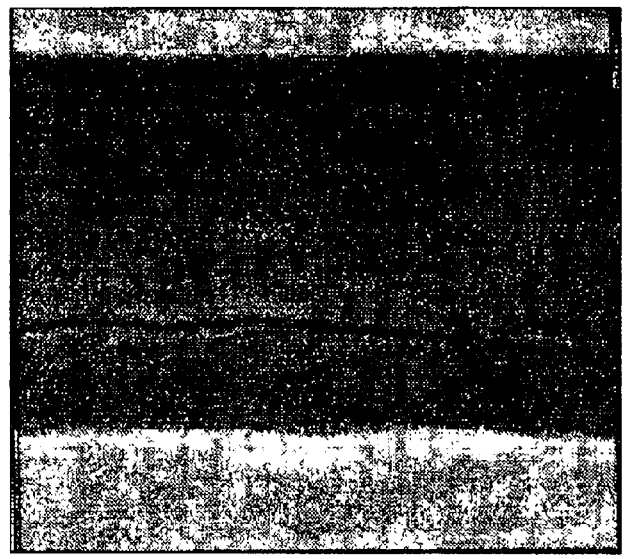
FIG. 15 is an SEM micrograph illustrating a conventional semiconductor device having a crack.
Figure 16:
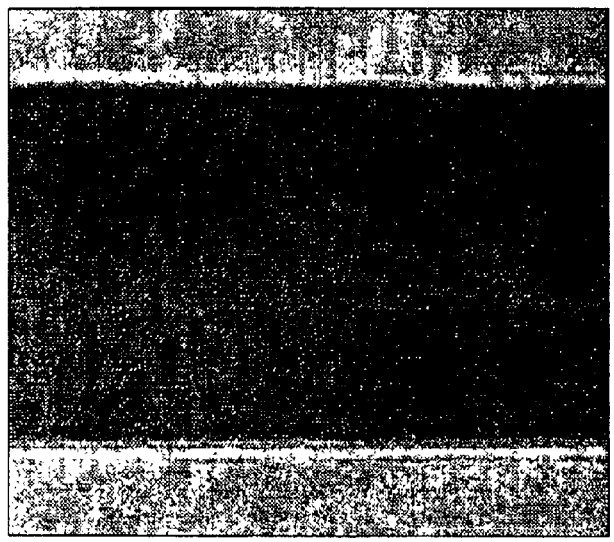
FIG. 16 is an SEM micrograph illustrating a semiconductor device having no crack according to the preferred embodiments of the present invention.

FIG. 15 is an SEM micrograph illustrating a conventional semiconductor device having a crack, and FIG. 16 is an SEM micrograph illustrating the semiconductor device having no crack according to the preferred embodiments of the present invention.

As described above, by providing a space greater than 1.0 μm between two adjacent metal line patterns or by forming a slit at a location adjacent to the space between two adjacent metal line patterns according to the preferred embodiments of the present invention, an occurrence of a crack may be prevented, thereby leading to high reliability and a high manufacturing yield.

While the invention has been particularly shown and described with reference to preferred embodiments thereof, it will be understood by those skilled in the art that the foregoing and other changes in form and details may be made therein without departing from the spirit and scope of the invention.

Thus, the techniques that prevent a crack from occurring in one or more layers underlying a metal line layer in a semiconductor device and a method of manufacturing the same have been described according to the present invention. While the invention is susceptible to various modifications and alternative forms, specific embodiments have been shown by way of example in the drawings and described in detail herein. However, it should be understood that the invention is not limited to the particular metal line pattern dimensions and processing conditions disclosed herein. Rather, the invention covers all modifications, equivalents, and alternatives falling within the spirit and scope of the invention as defined in the appended claims.

What is claimed is:

1. A semiconductor device, comprising:
    a plurality of metal line patterns, wherein two adjacent metal line patterns are spaced less than 10 µm apart from each other, and each of the two adjacent metal line patterns has a slit.

2. A semiconductor device as claimed in claim 1, wherein the slit has a width of greater than 1.0 µm.

3. A semiconductor device as claimed in claim 2, wherein the slit is formed at a predetermine distance from an edge of the metal line pattern.

4. A semiconductor device as claimed in claim 3, wherein the predetermined distance is less an 4 µm.

5. A semiconductor device having a multi-layered structure, comprising:
    a metal line layer having a plurality of metal line patterns spaced less than 10 µm apart from each other;
    at least one underlying layer under the metal line layer; and
    a slit formed in each of two adjacent metal line patterns at a sufficient distance from a space between the two adjacent metal line patterns to prevent a crack from occurring in the underlying layer.

6. A semiconductor device as claimed in claim 5, wherein the slit is formed in a direction parallel to the space between two adjacent metal line patterns.

7. A semiconductor device as claimed in claim 5, wherein the slit has a width greater than 1.0 µm.

8. A semiconductor device as claimed in claim 5, wherein the distance from the space between the two adjacent metal line patterns to the slit is less than 4.0 µm.

9. A semiconductor device, comprising:
    a plurality of metal line patterns, wherein two adjacent metal line patterns are spaced less than 1.5 µm apart from each other, and each of the two adjacent metal line patterns has a slit.

10. A semiconductor device having a multi-layered structure, comprising:
    a metal line layer having a plurality of metal line patterns spaced apart from each other;
    at least one underlying layer under the metal line layer; and
    a slit formed in each of two adjacent metal line patterns less than 4 µm from a space between the two adjacent metal line patterns in order to prevent a crack from occurring in the underlying layer.

* * * * *